United States Patent
Lee et al.

(10) Patent No.: US 7,701,795 B2
(45) Date of Patent: Apr. 20, 2010

(54) CONTROLLING EXECUTION OF ADDITIONAL FUNCTION DURING A REFRESH OPERATION IN A SEMICONDUCTOR MEMORY DEVICE

(75) Inventors: Dong-Woo Lee, Suwon-si (KR); Jung-Yong Choi, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 270 days.

(21) Appl. No.: 11/811,601

(22) Filed: Jun. 11, 2007

(65) Prior Publication Data

US 2007/0297260 A1  Dec. 27, 2007

(30) Foreign Application Priority Data

Jun. 16, 2006  (KR) ...................... 10-2006-0054272

(51) Int. Cl.
G11C 7/00 (2006.01)
(52) U.S. Cl. .................. 365/222; 365/212; 365/230.06; 365/230.08
(58) Field of Classification Search ................. 365/222, 365/212, 230.08, 230.06
See application file for complete search history.

(56) References Cited

U.S. PATENT DOCUMENTS 6,349,068 B2 *  2/2002  Takemae et al. ............ 365/222
6,438,057 B1     8/2002  Ruckerbauer ............... 365/222
7,072,237 B2 *   7/2006  Morgan et al. .............. 365/222
2006/0092741 A1 * 5/2006  Kim et al. ................... 365/222

OTHER PUBLICATIONS

Korean Patent Application No. 1020010016016 to Cho et al., having Publication date of Oct. 9, 2002 (w/ English Abstract page).
Korean Patent Application No. 1020030057245 to Park, having Publication date of Mar. 3, 2005 (w/ English Abstract page).
Korean Patent Application No. 1020030088986 to Cho et al., having Publication date of Jun. 14, 2005 (w/ English Abstract page).
Japanese Patent Application No. 2002-308624 to Hiroyuki, having Publication date of May 20, 2004 (w/ English Abstract page).
Korean Patent Application No. 1019970018532 to Kim, having Publication date of Nov. 22, 1999 (w/ English Abstract page).
Korean Patent Application No. 1020030034898 to Choi et al., having Publication date of Dec. 8, 2004 (w/ English Abstract page).
Korean Patent Application No. 1020040011063 to Kim et al., having Publication date of Aug. 24, 2005 (w/ English Abstract page).
Japanese Patent Application No. 2001-331304 to Isamu et al., having Publication date of May 9, 2003 (w/ English Abstract page).

* cited by examiner

*Primary Examiner*—Pho M. Luu

(57) ABSTRACT

A semiconductor memory device includes a mode register, an additional function executer, and an additional function controller. The mode register activates an additional function control signal when a mode register set code indicates that an additional function is to be executed concurrently with a refresh operation. The additional function controller controls the additional function executer to carry out the additional function concurrently with the refresh operation when the additional function control signal is activated.

20 Claims, 7 Drawing Sheets

CONTROLLING EXECUTION OF ADDITIONAL FUNCTION DURING A REFRESH OPERATION IN A SEMICONDUCTOR MEMORY DEVICE

BACKGROUND OF THE INVENTION

This application claims priority under 35 USC § 119 to Korean Patent Application No. 2006-54272, filed on Jun. 16, 2006 in the Korean Intellectual Property Office, the disclosure of which is incorporated herein in its entirety by reference.

1. Field of the Invention

The present invention relates generally to semiconductor memory devices, and more particularly, to controlling execution of an additional function concurrently during execution of a refresh operation in a semiconductor memory device such as a dynamic random access memory device (DRAM).

2. Background of the Invention

Semiconductor memory devices, and especially DRAMs (dynamic random access memories), refresh each memory cell at regular intervals in order to retain data. A refresh operation of a semiconductor memory device may be categorized into an auto-refresh operation and a self-refresh operation.

A semiconductor memory device performs an auto-refresh operation when an external controller applies a refresh signal to the semiconductor memory device in a steady mode. In that case, a row of memory cells of a memory cell array are refreshed for each auto-refresh operation. A counter of the semiconductor memory device increases a row address for consecutive auto-refresh operations. Thus, when the counter of the semiconductor memory device reaches the end row of the memory cell array, the counter returns to a first row of the memory cell array.

In comparison, when the semiconductor memory device does not operate for longer than a predetermined period of time, an internal refresh signal is periodically generated so that the semiconductor memory device performs a self-refresh operation.

FIG. 1 is a block diagram of a conventional semiconductor memory device. Referring to FIG. 1, when the semiconductor memory device performs a read/write operation, an address register 11 receives an externally generated address ADD in response to an active signal ACT and a read/write signal RD/WR, divides the address ADD into a row address RA and a column address CA, and outputs the row address RA and the column address CA to a row decoder 12 and a column decoder 13, respectively. During an auto-refresh operation, the address register 11 does not output such addresses RA and CA to the row decoder 12 or the column decoder 13 since a refresh circuit portion 20 generates an internal row address IRA to perform a refresh operation.

During an active read/write operation, the row decoder 12 receives the row address RA from the address register 11 in response to the active signal ACT, decodes the row address RA, and designates a specific row of memory cells of a memory cell array 14 for the read/write operation. During the auto-refresh operation, the row decoder 12 receives the internal row address IRA from the refresh circuit portion 20 in response to an auto-refresh signal ARF and designates a row of memory cells of the memory cell array 14 to be refreshed.

The column decoder 13 receives the column address CA from the address register 11, decodes the column address CA, and designates a specific column of memory cells of the memory cell array 14 for the read/write operation. However, since the memory cells are refreshed a row at a time, the column decoder 13 does not operate during the refresh operation.

The memory cell array 14 includes a plurality of word lines, which are arranged in rows, and a plurality of bit lines, which are arranged in columns. Memory cells are arranged at respective intersections between the word lines and the bit lines. The memory cell array 14 further includes a plurality of sense amplifiers that sense and amplify data from the memory cells.

The memory cells of a word line of the memory cell array 14 are selected by the row decoder 12, and the sense amplifier is selected by the column decoder 13. The sense amplifier selected by the column decoder 13 amplifies data DQ of the selected memory cell and outputs the amplified data DQ to an external device in response to a read signal RD. Alternatively, the sense amplifier stores data DQ input from the external device into the selected memory cell in response to the write signal WR. The RD/WR signal is generated from a command decoder 17 to a data input/output portion 15.

Also, the sense amplifiers amplify data stored in the memory cells of the word line indicated by the refresh circuit portion 20 and re-store the amplified data therein when the semiconductor memory device performs the refresh operation.

A mode register 16 receives a mode register set (MRS) signal MRS from the command decoder 17 upon power-up of the semiconductor memory device. The mode register 16 decodes mode register set codes which are applied at address lines by an external device in response to the mode register set signal MRS and stores fundamental operational modes of the semiconductor memory device. The mode register set codes may be applied at address lines ADD of the address register 11 or may be applied as data DQ at the data input/output portion 15.

The command decoder 17 analyzes a command COM from the external device to generate the mode register set signal MRS that is an initial set signal of the semiconductor memory device to the mode register 16. The command decoder 17 also generates the auto-refresh signal ARF to the refresh circuit portion 20 and the address register 11. Further, the command decoder 17 generates the read/write signal RD/WR for controlling the data input/output portion 15.

The refresh circuit portion 20 receives the auto-refresh signal ARF from the command decoder 17 and generates the internal row address IRA to the row decoder 12. Such an internal row address IRA indicates the row of memory cells of the memory cell array 14 to be refreshed.

FIG. 2 is a detailed block diagram of the refresh circuit portion 20 of FIG. 1. The refresh operation of the conventional semiconductor memory device will now be described with reference to FIG. 2. Referring to FIG. 2, a control signal generator 21 receives the auto-refresh signal ARF from the command decoder 17 and generates a refresh selection signal PRESH and an active command PRB.

During a self-refresh operation, a self-refresh signal generator 30 receives the refresh selection signal PRESH, and periodically generates a self-refresh signal SRFHP to an internal address generator 40 for performing a self-refresh operation. The internal address generator 40 generates a refresh address CNTi corresponding to the word line WL of the memory cell array 14 to be refreshed. A refresh generator 41 receives the refresh selection signal PRESH and the self-refresh signal SRFHP and generates a refresh signal PRFH during the self-refresh operation.

On the other hand, the refresh generator 41 receives the refresh selection signal PRESH and generates the refresh signal PRFH during the auto-refresh operation. A refresh pulse generator 44 generates a refresh pulse PRCNTP in response to the refresh signal PRFH. A refresh pulse counter 45 counts the refresh pulse PRCNTP and generates the refresh address CNTi. A counter latch 46 latches the refresh address CNTi and outputs the latched refresh address CNTi in response to the refresh pulse PRCNTP.

A refresh mode generator 42 outputs a refresh mode signal SRSP in response to the refresh signal PRFH. An active generator 43 outputs an active signal PRD in response to the active command PRB and the refresh mode signal SRSP. An internal address selector 47 outputs the refresh address CNTi as the internal row address IRA to the row decoder 12 in response to the active signal PRD.

The row decoder 12 receives the internal row address IRA from the internal address generator 40 in response to the auto-refresh signal ARF and enables the corresponding word line WL of the memory cell array 14. As illustrated in FIG. 2, since the semiconductor memory device performs the refresh operation for updating data stored in the memory cells MC of the memory cell array 14, the data input/output portion 15 of FIG. 1 for reading or writing data is typically not used during the refresh operation. In other words, while the semiconductor memory device is performing the refresh operation, some blocks including the data input/output portion 15 are not used.

Also, with demand for high operating speed of the semiconductor memory device, new functions are being added to the semiconductor memory device. For example, a semiconductor memory device may additionally execute a temperature sensing function. Generally, as the operating speed of a semiconductor memory device increases, the temperature of the semiconductor memory device also increases in proportion to the operating speed.

When the temperature of the semiconductor memory device is increased, the semiconductor memory device may become inoperative. However, when the temperature sense function is added, the semiconductor memory device includes a temperature sensor to periodically check a temperature and inform an external controller of the present temperature. The external controller then generates a control command to temporarily stop or slow down the operation of the semiconductor memory device when the temperature is undesirably high. As a result, the reliability of the semiconductor memory device may be enhanced.

Another example of an additional function of a semiconductor memory device is controlling the input/output impedance of a driver circuit of the semiconductor memory device, as described in Korean Patent Publication No. 10-2005-0019453. In that case, the impedance of the driver circuit is controlled using a single external reference resistor and a single impedance code generator. However, the conventional semiconductor memory device principally employs the data input/output portion 15 shown in FIG. 1 in order to perform the additional function.

In other words, although the conventional semiconductor memory device does not use the data input/output portion 15 during the refresh operation, the impedance at the data input/output portion 15 is desired to be controlled. In the prior art, the refresh operation and the adjustment of the impedance at the data input/output portion 15 are performed during separately designated times resulting in loss of operating time.

SUMMARY OF THE INVENTION

Accordingly, the present invention provides flexible control of execution of additional function(s) concurrently with execution of a refresh operation.

A semiconductor memory device according to an aspect of the present invention includes a mode register, an additional function executer, and an additional function controller. The mode register activates an additional function control signal when a mode register set code indicates that an additional function is to be executed concurrently with a refresh operation. The additional function controller controls the additional function executer to carry out the additional function concurrently with the refresh operation when the additional function control signal is activated.

In another embodiment of the present invention, the additional function controller controls the additional function executer also according to a control code that is generated by an address register from an address signal that is externally generated.

In a further embodiment of the present invention, the mode register set code is externally generated and input by the mode register through address lines when a MRS (mode register set) signal is activated. The semiconductor memory device further includes a command decoder that receives a command that is externally generated to activate the MRS signal upon power-up of the semiconductor memory device.

In another embodiment of the present invention, the semiconductor memory device further includes a memory cell array for storing data and a data input/output portion. The data input/output portion does not transfer data to/from the memory cell array during the refresh operation, and transfers information for the additional function during the refresh operation.

In a further embodiment of the present invention, the semiconductor memory device further includes a command decoder that receives a command that is externally generated to activate an active signal and a read/write signal for performing a read/write operation on the memory cell array. In that case, the data input/output portion transfers data to/from the memory cell array during the read/write operation performed while the refresh operation is not being performed.

In another embodiment of the present invention, the command decoder activates a refresh signal when a command indicates that the refresh operation is to be executed. The semiconductor memory device includes a refresh circuit for incrementing an internal row address for indicating a row of memory cells to be refreshed upon activation of the refresh signal. The additional function controller controls the additional function executer to perform the additional function upon activation of the refresh signal.

In an example embodiment of the present invention, the refresh signal is an auto-refresh signal.

In a further embodiment of the present invention, the additional function executer is a temperature sensing portion including a temperature sensor and an analog-to-digital (A/D) converter. The temperature sensor senses a temperature of the semiconductor memory device. The A/D converter converts the temperature sensed by the temperature sensor into digital temperature data that is output via the data input/output portion of the semiconductor memory device in response to the activated refresh signal.

In another embodiment of the present invention, the additional function executer is a driver circuit having an impedance that is controlled in response to a control signal from the additional function controller. For example, the driver circuit receives data from a data input/output portion to output the received data to an external device during a read operation, and the driver circuit receives data from the external device to transmit the received data to the data input/output portion during a write operation.

In a further embodiment of the present invention, the driver circuit includes an impedance control circuit, a termination circuit, and an output driver circuit. The impedance control circuit is coupled to an external reference resistor and generates impedance control codes depending on the impedance of the external reference resistor in response to the control signal. The termination circuit has a respective impedance determined by the impedance control codes for preventing reflection of data from an external device. The output driver circuit has a respective impedance determined by the impedance control codes for driving data to be output to the external device.

In another embodiment of the present invention, the additional function controller outputs a plurality of control signals according to a control code indicated by an external device. In that case, the additional function executer executes a respective one of a plurality of additional functions in response to each of the control signals.

In this manner, the additional function(s) of the semiconductor memory device may be flexibly controlled to be executed during execution of the refresh operation. Thus, operating time may be saved for enhanced efficiency of the semiconductor memory device.

BRIEF DESCRIPTION OF THE DRAWINGS

The above and other features and advantages of the present invention will become more apparent when described in detailed example embodiments thereof with reference to the attached drawings in which.

The figures referred to herein are drawn for clarity of illustration and are not necessarily drawn to scale. Elements having the same reference number in FIGS. 1, 2, 3, 4, 5, 6, and 7 refer to elements having similar structure and/or function.

DETAILED DESCRIPTION OF THE INVENTION

When power is applied to a semiconductor memory device, a command decoder generates an mode register set (MRS) signal, and an external controller (typically, a central processing unit (CPU)) stores an operating mode, i.e., an initial set mode such as a column address strobe (CAS) latency mode or a burst length mode, in a mode register of the semiconductor memory device.

A series of codes indicating a mode of the semiconductor memory device is stored in the mode register. These codes are often referred to as a mode register set (MRS) code. The mode register set code is sometimes applied via data lines, but more typically is applied via address lines. Conventionally, the mode register set code may be generated by combining addresses. The operating mode of the semiconductor memory device is determined according to the mode register set code. The mode register set code is generated typically according to the Joint Electron Device Engineering Council (JEDEC) standard.

In addition to the standardized mode register set codes, undesignated mode register set codes are also stored into the mode register. In the present invention, at least one of the undesignated mode register set codes (such as an unused bit or a combination of unused bits of the mode register set codes) are used in a semiconductor memory device to control execution of an additional function concurrently during execution of a refresh operation.

Figure 3:
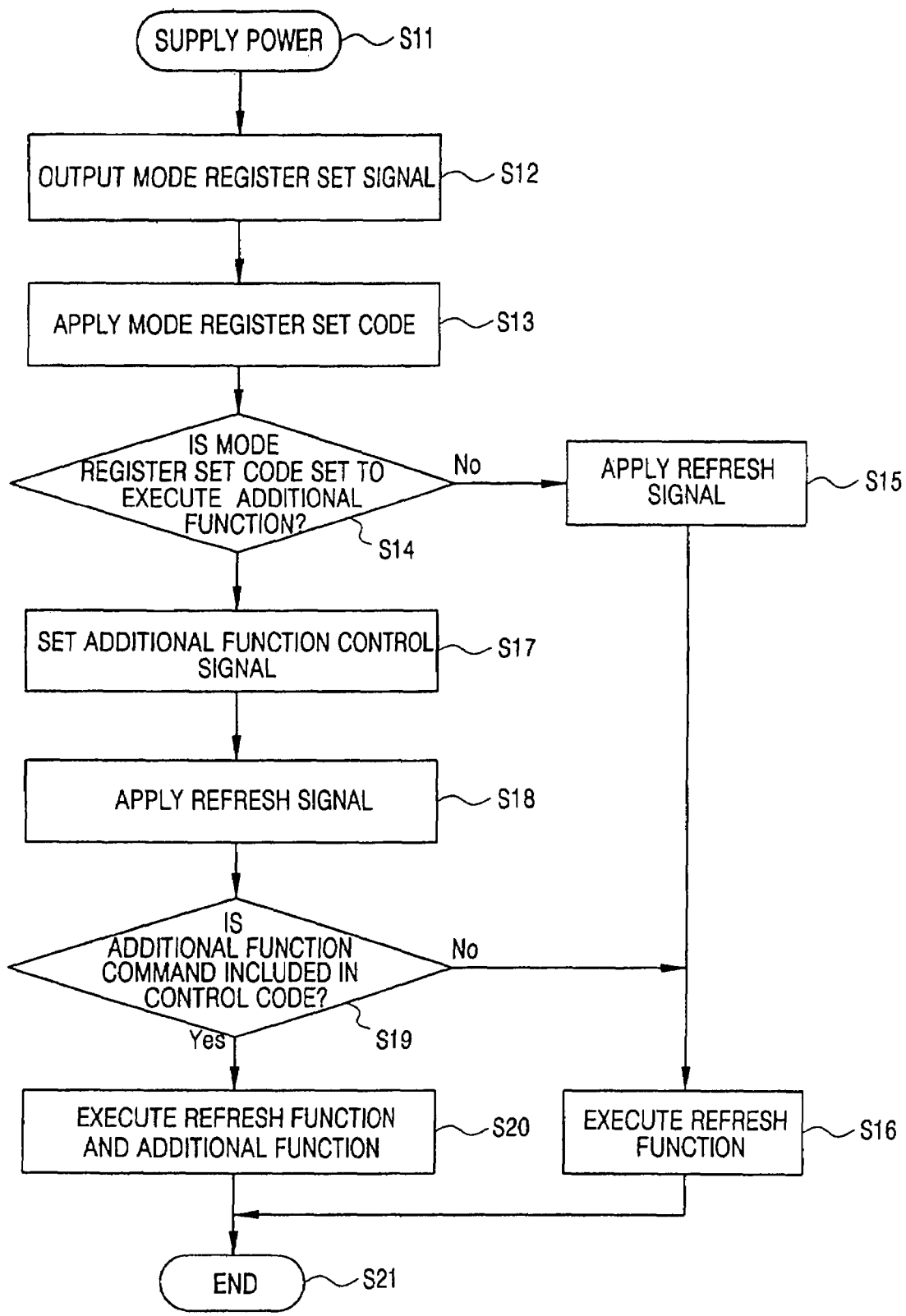
FIG. 3 is a flowchart of steps during operation of a semiconductor memory device that executes an additional function concurrently with execution of a refresh operation, according to an example embodiment of the present invention.

FIG. 3 is a flowchart of steps during operation of a semiconductor memory device for concurrently performing an additional function during execution of a refresh operation, according to an example embodiment of the present invention. Referring to FIG. 3, when power is applied on the semiconductor memory device during power-up (step S11), a command decoder generates a mode register set (MRS) signal that is activated to a mode register for setting a mode of the semiconductor memory device (step S12).

In the semiconductor memory device, a mode register set code is generated by an external controller to the mode register (step S13). The semiconductor memory device determines whether the mode register set code is set to indicate that an additional function is to be performed concurrently with a refresh operation (step S14). If the mode register set code is not so set, when a refresh signal is activated in step S15, the semiconductor memory device performs a refresh operation (step S16) alone as in a conventional semiconductor memory device.

However, if the mode register set code is set for indicating that the additional function is to be performed concurrently with a next refresh operation, an additional function control signal is activated (step S17). In that case, when a refresh signal is activated in step S18, the semiconductor memory device determines whether an additional function command is included in a control code applied along with the refresh signal (step S19). When the additional function command is not included, the semiconductor memory device performs just the refresh operation (step S15). When the additional function command is included, the semiconductor memory device performs the refresh operation concurrently with the designated additional function (step S20).

The control code is generated from an address applied at an address register, along with generation of the refresh signal. During the refresh operation, such as an auto-refresh operation or a self-refresh operation, the semiconductor memory device generates an address internally for executing the refresh operation. Thus, the semiconductor memory device operates regardless of an externally applied address. Thus, the address is used for indicating a control code during the refresh operation.

FIG. 3 illustrates the example of a single additional function that is executed concurrently, such as simultaneously, with performance of a refresh operation. However, a plurality of additional functions may be designated as different addresses so that different additional functions may be executed during respective refresh operations.

Also, the additional function may be advantageously performed during an auto-refresh operation. A self-refresh operation is typically performed when no command is generated from an external controller to the semiconductor memory device. In that case, the external controller does not respond to data of the additional function as output from the semiconductor memory device.

Therefore, example embodiments of the present invention are now described based on an auto-refresh operation. However, the present invention may also be practiced for a self-refresh operation as would be apparent to one of ordinary skill in the art from the description herein.

Figure 4:
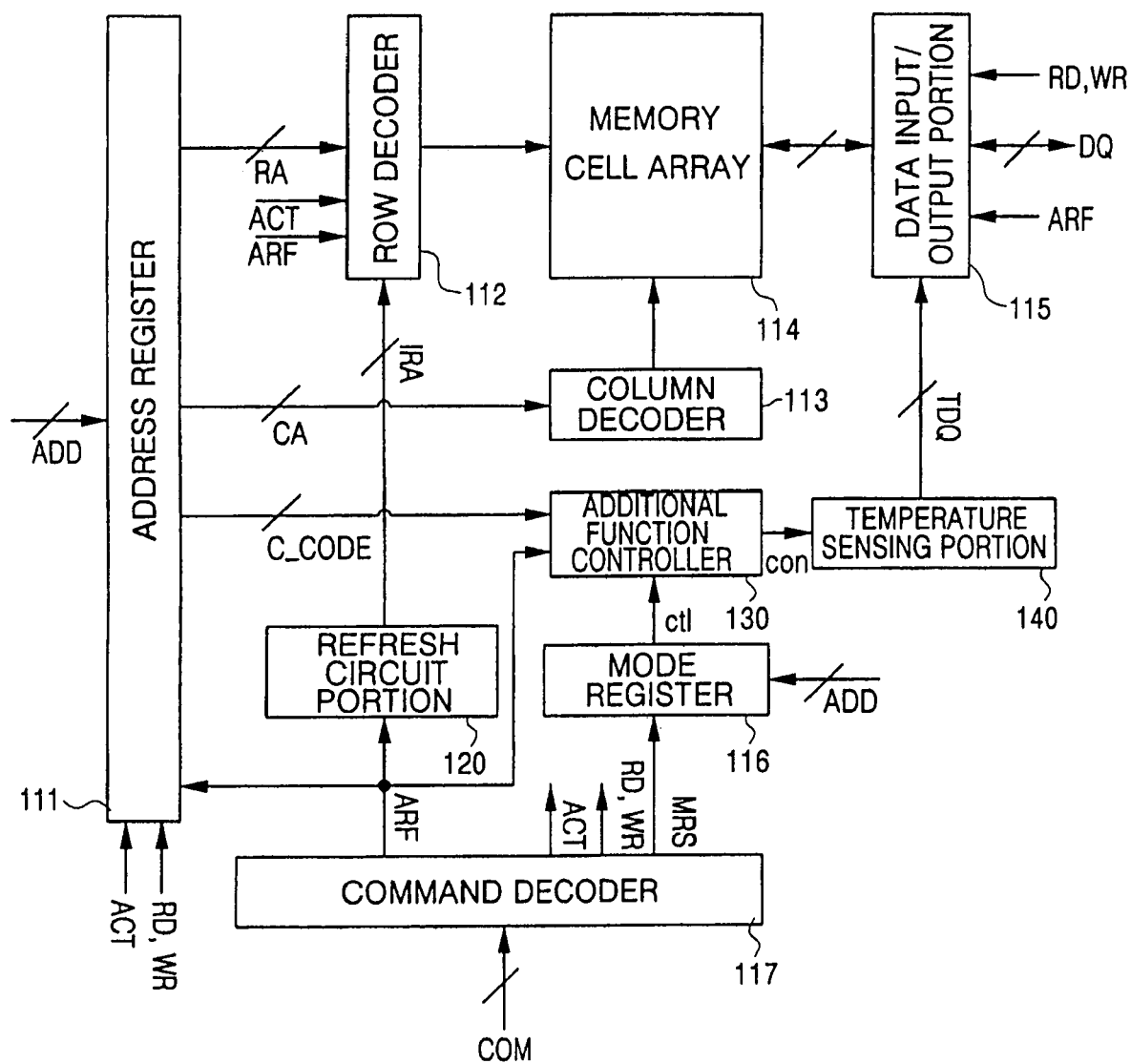
FIG. 4 is a block diagram of a semiconductor memory device that performs an additional function of sensing a temperature of the semiconductor memory device concurrently with execution of a refresh operation, according to an example embodiment of the present invention.

FIG. 4 is a block diagram of a semiconductor memory device that performs an additional function of sensing a temperature of the semiconductor memory device concurrently with execution of a refresh operation, according to an example embodiment of the present invention, During a read or write active operation, an address register 111 receives an address ADD from an external device in response to an active signal ACT and a read/write signal RD/WR generated from a command decoder 117. The address register 111 also divides the address ADD into a row address RA and a column address CA that are output to a row decoder 112 and a column decoder 113, respectively.

During an auto-refresh operation, the address register 111 receives an auto-refresh signal ARF from the command decoder 117 and applies a control code C_CODE to an additional function controller 130. In the example of FIG. 4, the address register 111 generates the control code C_CODE from the address ADD. However, the present invention may be practiced with the control code C_CODE being generated from other types of signals aside from the example of the address signal ADD. For example, when the address ADD is used to generate the control code C_CODE, 1 bit or a plurality of bits may be generated depending on the additional function.

During the read or write active operation, the row decoder 112 receives the row address RA from the address register 111 in response to the active signal ACT, decodes the row address RA, and designates a specific row of memory cells of the memory cell array 114. During the refresh operation, the row decoder 112 receives an internal row address IRA from a refresh circuit portion 120 in response to an auto-refresh signal ARF and designates a specific row of memory cells of the memory cell array 114 to be refreshed.

During the read or write active operation, the column decoder 113 receives the column address CA from the address register 111, decodes the column address RA, and designates a specific column of memory cells of the memory cell array 114. During the refresh operation, since the semiconductor memory device performs the refresh operation one row of memory cells at a time, the column decoder 113 does not perform any function.

The memory cell array 114 includes a plurality of word lines disposed along rows of memory cells, and includes a plurality of bit lines disposed along columns of memory cells. The memory cells are disposed at respective intersections between the word lines and the bit lines.

Also, the memory cell array 114 also includes a plurality of sense amplifiers to sense and amplify data stored in the memory cells. During a read operation, one word line of the memory cell array 114 is selected by the row decoder 112, and data of the memory cells coupled to the selected word line is transmitted to and amplified by the corresponding sense amplifiers. Also, when a specific sense amplifier is selected by the column decoder 113, the selected sense amplifier outputs the amplified data DQ to a data input/output portion 115.

During a write operation, data DQ from the external device is transmitted to a sense amplifier selected by the column decoder 113. In addition, such data DQ is stored into a memory cell coupled to the selected sense amplifier and the word line selected by the row decoder 112.

During a refresh operation in the memory cell array 114, the data stored in the memory cells coupled to the word line selected by the row decoder 112 is amplified by the sense amplifiers and then re-stored.

The command decoder 117 analyzes a command COM generated from an external device such as an external controller. The command decoder 117 decodes the command COM to generate the active signal ACT, the read/write signal RD/WR, the auto-refresh signal ARF, and the mode register set signal MRS.

When power is supplied to the semiconductor memory device upon power-up, the command decoder 117 activates the mode register set signal MRS to a mode register 116. During the auto-refresh operation, the command decoder 117 activates the auto-refresh signal ARF to the address register 111, the refresh circuit portion 120, and the data input/output portion 115 such that the semiconductor memory device executes the refresh operation and an additional function concurrently, such as simultaneously for example.

During the read or write active operation, the command decoder 117 generates the active signal ACT to the address register 111 depending on whether the active operation is a read operation or a write operation. Also in that case, the command decoder 117 activates the read/write signal RD/WR to the address register 111 and the data input/output portion 115.

The mode register 116 receives and stores the mode register set code which is applied on the address lines ADD from an external device such as an external controller in response to the mode register set signal MRS activated from the command decoder 117. For example, when the MRS signal from the command decoder 117 is activated, the mode register 116 decodes the mode register set code ADD to store operational modes and/or specifications of the semiconductor memory device.

For instance, the mode register set code itself may be stored in the mode register 116 which not only indicates a test mode, a CAS latency, and a burst length but also indicates whether an additional function is to be executed by the semiconductor memory device concurrently with a refresh operation. If the mode register set code indicates that such an additional function is to be executed, the mode register 116 activates an additional function control signal "ctl" that is output to the additional function controller 130.

Figure 1:
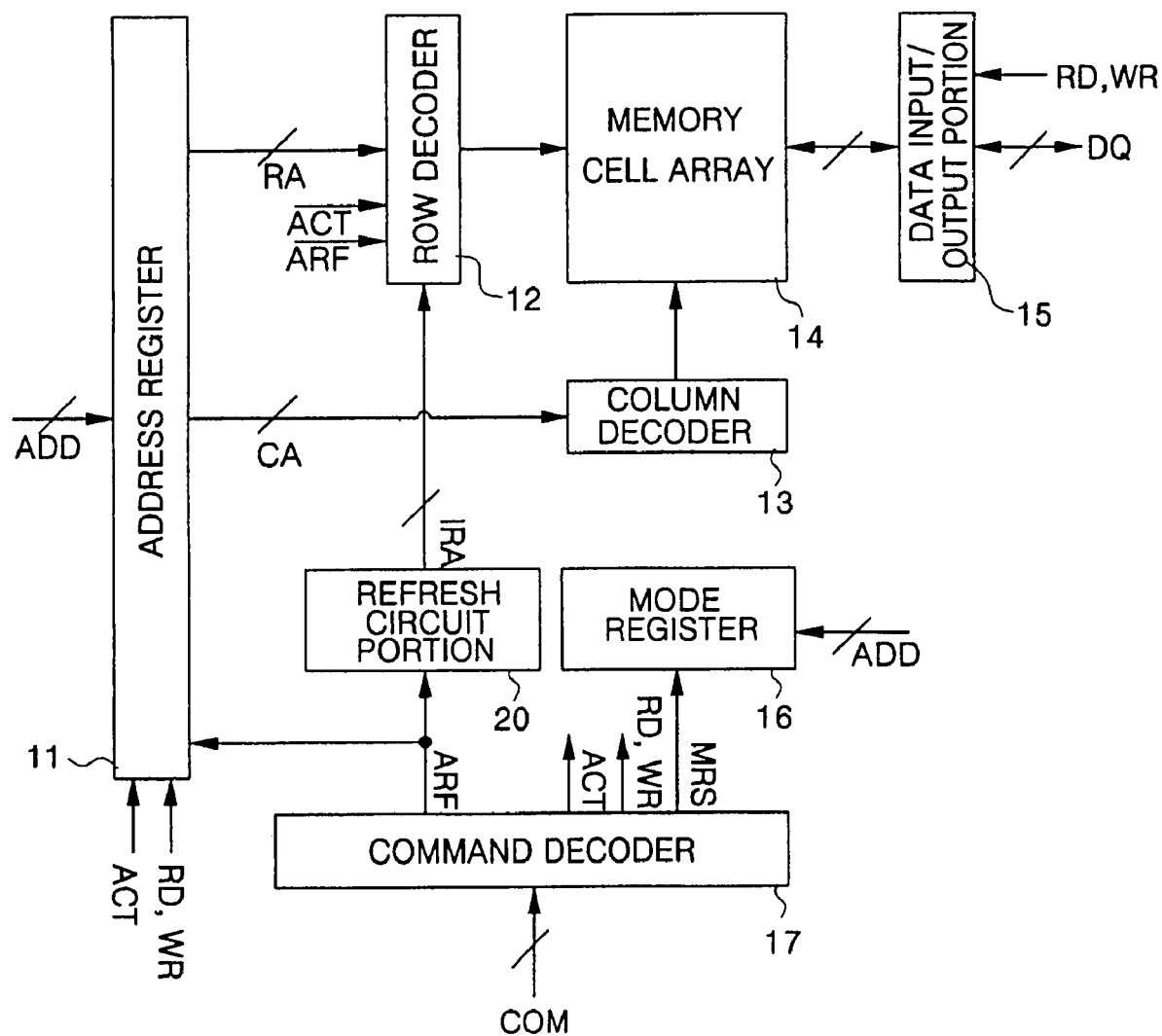
FIG. 1 is a block diagram of a conventional semiconductor memory device.
Figure 2:
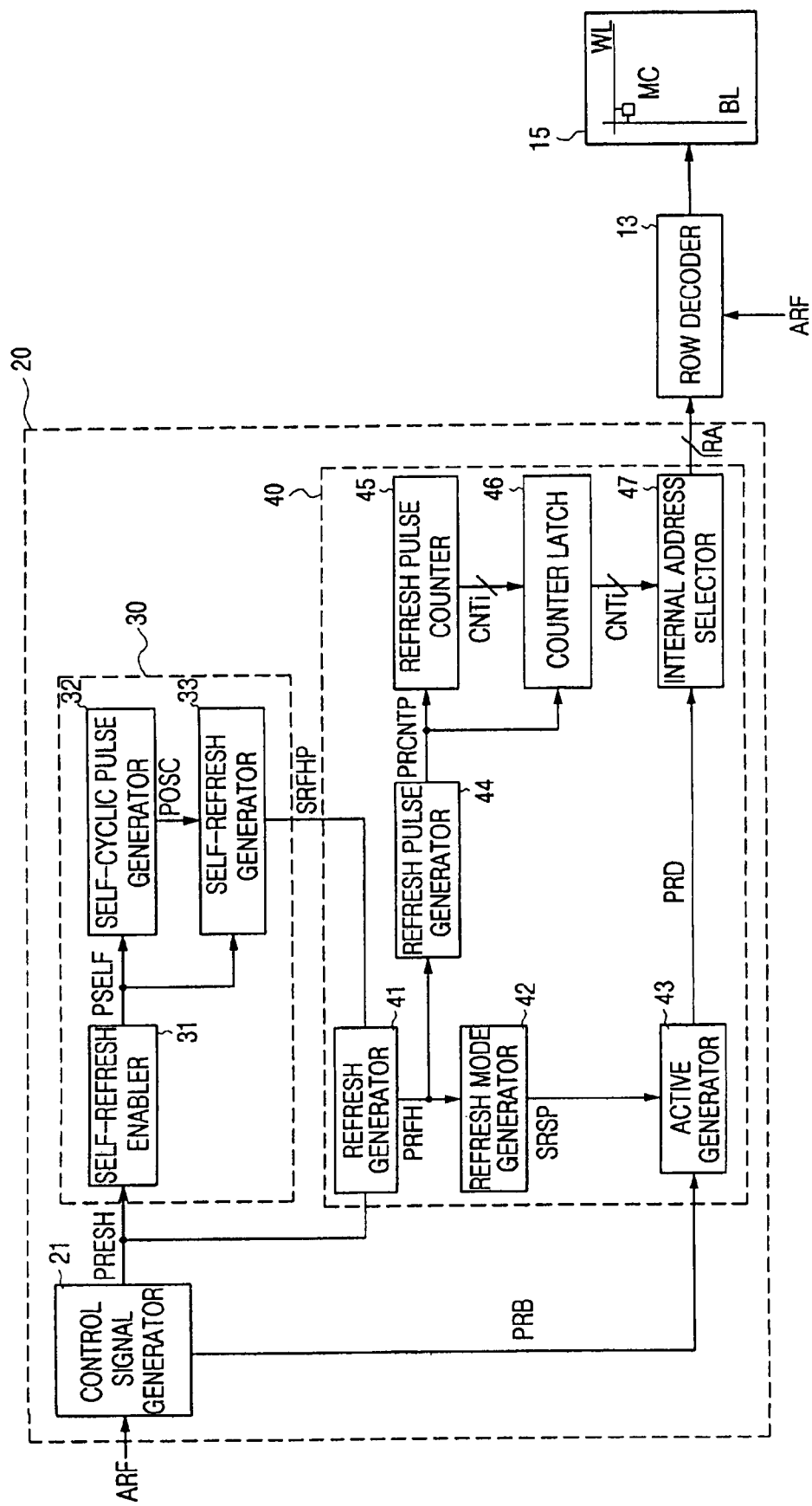
FIG. 2 is a detailed block diagram of a refresh circuit portion of the conventional semiconductor memory device of FIG. 1.

The refresh circuit portion 120 receives the auto-refresh signal ARF from the command decoder 117 and generates the internal row address IRA for indicating the one row of memory cells of the memory cell array 114 to be refreshed during each auto-refresh operation. The refresh circuit portion 120 may be implemented similarly as illustrated in FIG. 2.

The additional function controller 130 is enabled in response to the activated additional function control signal "ctl" from the mode register 116. During the auto-refresh operation with the auto-refresh signal ARF being activated from the command decoder 117, the additional function controller 130 also receives the control code C_CODE from the address register 111. In one embodiment of the present invention, the control code C_CODE is set to further confirm that the additional function is to be executed. In that case, the additional function controller 130 generates an activated control signal "con" to an additional function executer 140 that is a temperature sensing portion in FIG. 4.

Figure 7:
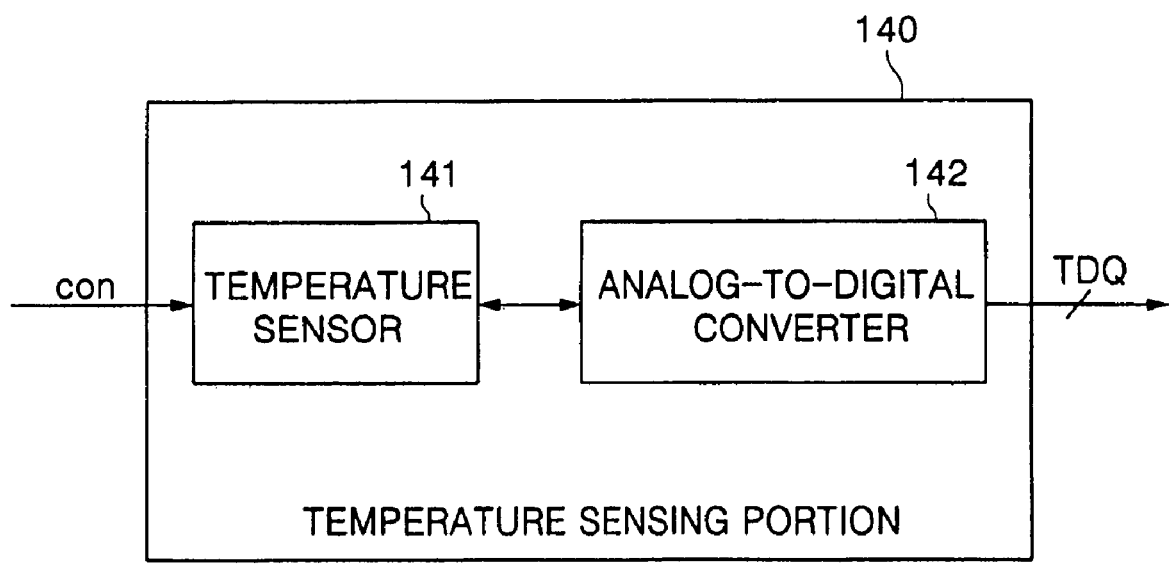
FIG. 7 is a block diagram of example components of a temperature sensing portion of FIG. 4, according to an example embodiment of the present invention.

Referring to FIGS. 4 and 7, the temperature sensing portion 140 includes a temperature sensor 141 and an analog-to-digital (A/D) converter 142. When the control signal "con" from the additional function controller 130 is activated, the temperature sensor 141 senses the temperature of the semiconductor memory device. The A/D converter 142 converts the sensed temperature into digital temperature data TDQ that is output to the data input/output portion 115.

During a read or write active operation, the data input/output portion 115 inputs data DQ from the memory cell array 114 or outputs the data DQ to the memory cell array 114, in response to the read/write signal RD/WR from the command decoder 117. During the read operation, the data input/output portion 115 receives the data DQ of a memory cell of the memory cell array 114 as selected by the row decoder 112 and the column decoder 113 and outputs such data DQ to the external device. During the write operation, the data input/output portion 115 transfers data DQ from the external device to the memory cell array 114 such that the data DQ is stored in a memory cell selected by the row decoder 112 and the column decoder 113.

During the refresh operation, the data input/output portion 115 does not operate to transfer data DQ between the external device and the memory cell array 114. Rather during the refresh operation, the data input/output portion 115 receives the temperature data TDQ from the temperature sensing portion 140 in response to the auto-refresh signal ARF from the command decoder 117 and outputs the temperature data TDQ to the external device.

Operation of the components of FIG. 4 according to the flow-chart of FIG. 3 is now described. When power is applied on the semiconductor memory device upon power-up, the command decoder 117 generates the activated mode register set signal MRS to the mode register 116 (step S12). Subsequently, the mode register 116 stores a mode register set code applied on address lines ADD by the external device for indicating various operational modes of the semiconductor memory device (step S13).

The mode register set code indicates whether an additional function is to be executed concurrently with refresh operations (step S14). If so, the mode register 116 generates an activated additional function control signal ctl output to the additional function controller 130 (step S17).

Also, when a command COM from an external controller indicates that an auto-refresh operation is to be performed, the command decoder 117 activates the auto-refresh signal ARF to the address register 111, the refresh circuit portion 120, the data input/output portion 115, and the additional function controller 130 (step S15). The address register 111 analyzes an address signal ADD from the external device to generate a control code C_CODE to the additional function controller 130 in response to the activated auto-refresh signal ARF.

The refresh circuit portion 120 generates the internal row address IRA indicating the word line to be refreshed in the memory cell array 114 in response to the activated auto-refresh signal ARF. The internal row address IRA is output to the row decoder 112. The row decoder 112 executes the refresh operation on the row of memory cells of the memory cell array 114 in response to the internal row address IRA (step S16).

Also, the additional function controller 130 receives the control code C_CODE from the address register 111 in response to the activated auto-refresh signal ARF and determines whether the control code C_CODE confirms that the additional function is to be executed (step S19). The control code C_CODE for indicating that the additional function is to be executed is predetermined by a user.

If the control code C_CODE confirms that the additional function is to be executed, the additional function controller 130 activates the control signal "con" for controlling the additional function executer 140 to execute the additional function (step S20). The temperature sensing portion 140 senses the temperature of the semiconductor memory device in response to the activated control signal con and generates the digitized temperature data TDQ to the data input/output portion 115. The data input/output portion 115 outputs the temperature data TDQ to the external device.

As described above, the semiconductor memory device of FIG. 4 is configured for sensing the temperature of the semiconductor memory device concurrently during the refresh operation. The external controller analyzes the temperature data TDQ and determines if such temperature of the semiconductor memory device is undesired. For example when the temperature of the semiconductor memory device is too high, the external controller controls the semiconductor memory device to stop operating or issues a stand-by command to decrease the temperature of the semiconductor memory device.

Figure 5:
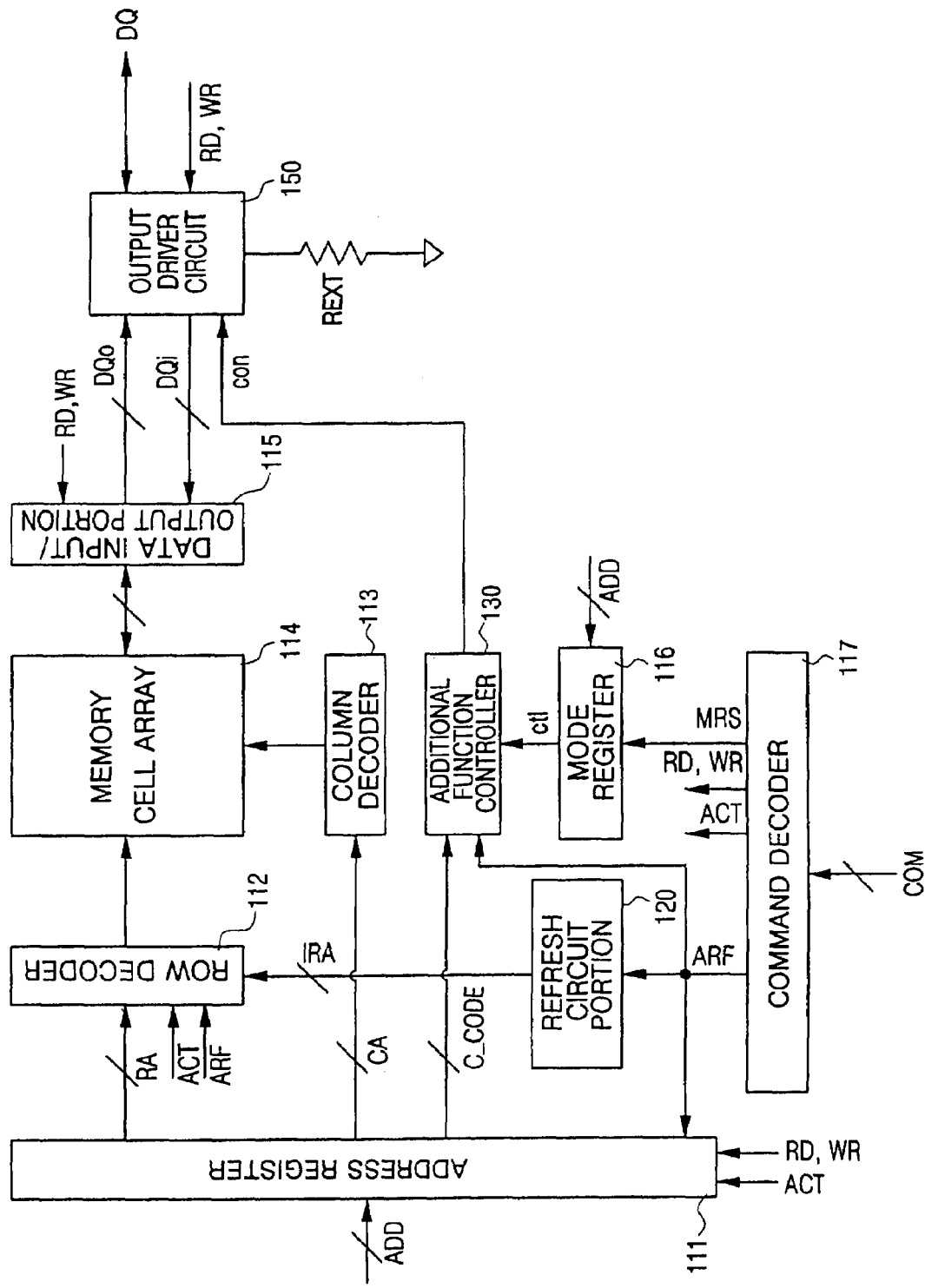
FIG. 5 is a block diagram of a semiconductor memory device that performs an additional function of controlling an impedance of a driver circuit concurrently with execution of a refresh operation, according to another example embodiment of the present invention.
Figure 6:
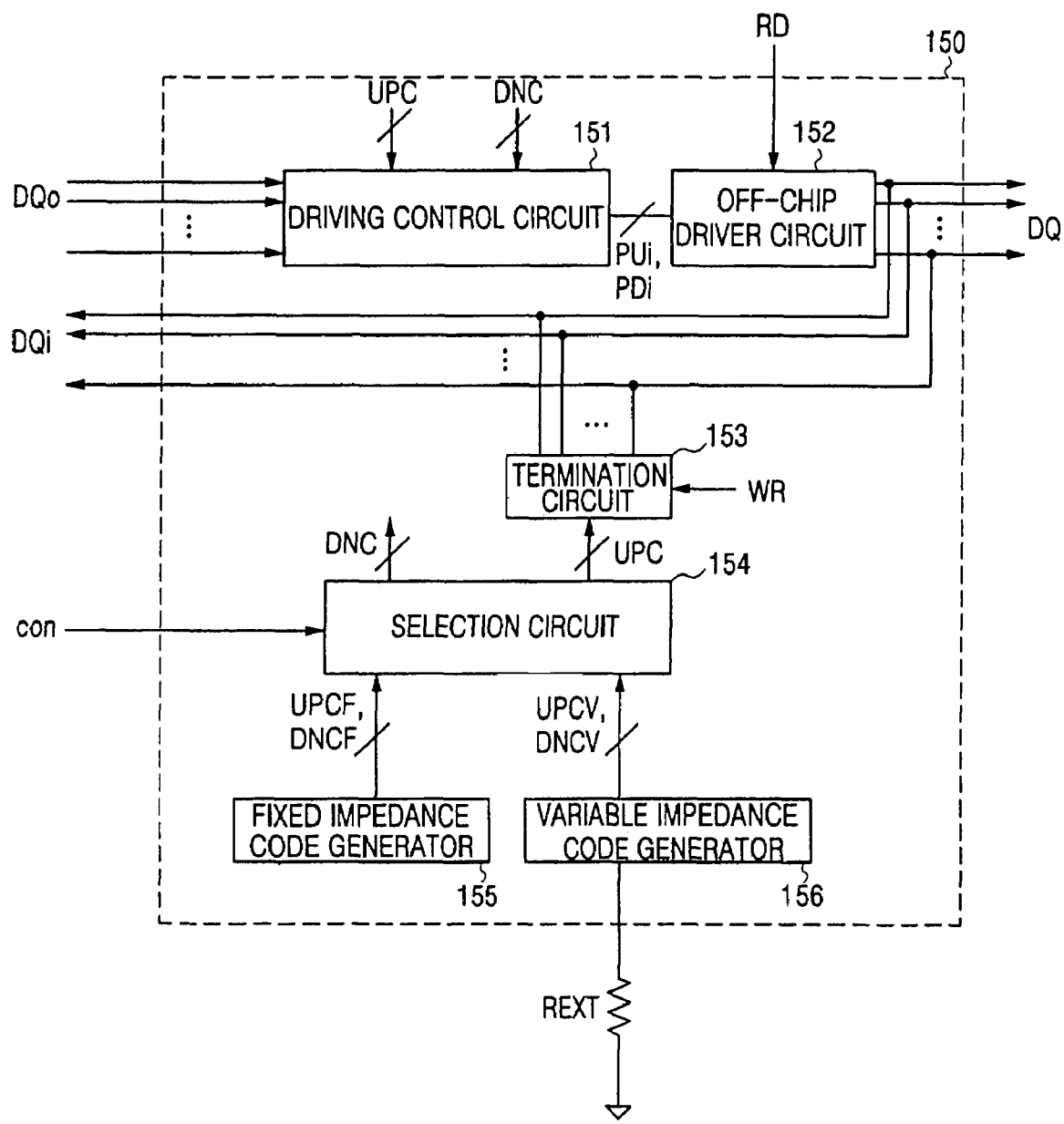
FIG. 6 is a detailed block diagram of the driver circuit of FIG. 5, according to an example embodiment of the present invention.

FIG. 5 is a block diagram of a semiconductor memory device that performs an additional function of controlling an impedance of a driver circuit 150 concurrently with execution of a refresh operation, according to another example embodiment of the present invention. FIG. 6 is a detailed block diagram of the driver circuit 150 of FIG. 5. Elements having the same reference number in FIGS. 4 and 5 refer to elements having similar structure and/or function.

Referring to FIGS. 5 and 6, the driver circuit 150 includes a termination circuit 153 and an off-chip driver circuit 152. The termination circuit 153 minimizes reflection of input data DQi from impedance mismatch when data DQ is input to the semiconductor memory device. The off-chip driver circuit 152 drives the output data DQo to an external device. The driver circuit 150 of FIG. 5 may be implemented similarly as disclosed in Korean Patent Publication No. 10-2005-0019453.

Referring to FIGS. 5 and 6, a fixed impedance code generator 155 generates fixed impedance control codes UPCF and DNCF such that the off-chip driver circuit 152 or the termination circuit 153 has predetermined fixed impedance. Here, the fixed impedance control codes UPCF and DNCF may be programmed using external data. A variable impedance code generator 156 is connected to an external reference resistor REXT and generates variable impedance control codes UPCV and DNCV that depend on the impedance of the external reference resistor REXT.

A selection circuit 154 selects one impedance code out of the fixed impedance control codes UPCF and DNCF from the fixed impedance code generator 155 and the variable impedance control codes UPCV and DNCV from the variable impedance code generator 156, in response to the control signal "con" from the additional function controller 130 of FIG. 5. The selection circuit 154 generates impedance control codes UPC and DNC from such selected impedance control codes.

The termination circuit 153 has an impedance that depends on the control code UPC from the selection circuit 154. With such control of the impedance of the termination circuit 153, the data DQ from the external device is not reflected but transmitted as input data DQi to the data input/output portion 115 during a write operation, thus improving signal integrity.

A driving control circuit 151 receives data DQo output from the data input/output portion 115 and outputs pull-up and pull-down control signals PUi and PDi in response to the impedance control codes UPC and DNC. The off-chip driver circuit 152 outputs the data DQ in response to the pull-up and pull-down control signals PUi and PDi. In this case, the impedance of the off-chip driver circuit 152 is controlled according to the selective activation of the pull-up and pull-down control signals PUi and PDi, thus improving the signal integrity of the data DQ output to the external device.

Generally, when the driver update command "con" to the driver circuit 150 is activated, the selection circuit 154 generates the impedance control signals UPC and DNC. Also, the determination circuit 153 operates during a write operation in response to the write signal WR from the command decoder 117. The off-chip driver circuit 152 operates during a read operation in response to the read signal RD from the command decoder 117.

Operation of the components of FIGS. 5 and 6 according to the flow-chart of FIG. 3 is now described. When power is applied to the semiconductor memory device upon power-up, the command decoder 117 generates an activated mode register set signal MRS to the mode register 116 (step S12). The mode register 116 stores a mode register set code applied on address lines ADD from the external device in response to the activated mode register set signal MRS (step S13).

When the mode register set code indicates that an additional function is to be executed concurrently with refresh operations (step S14), the mode register 116 activates an additional function control signal "ctl" to the additional function controller 130 (step S17). Also, when the external controller issues a command COM for executing an auto-refresh operation, the command decoder 117 activates the auto-refresh signal ARF to the address register 111, the refresh circuit portion 120, the data input/output portion 115, and the additional function controller 130 (step S15 or S18).

The address register 111 outputs the address ADD from the external as the control code C_CODE to the additional function controller 130 in response to the activated auto-refresh signal ARF. The refresh circuit portion 120 generates an internal row address IRA corresponding to a word line for the row of memory cells to be refreshed in the memory cell array 114, in response to the activated auto-refresh signal ARF. The row decoder 112 designates the row of memory cells of the memory cell array 114 to be refreshed in response to the internal row address IRA and performs the refresh operation (step S16 or S20).

Also, the additional function controller 130 receives the control code C_CODE from the address register 111 in response to the activated auto-refresh signal ARF and determines whether the control code C_CODE confirms that the additional function is to be executed (step S19). If the control code C_CODE confirms that the additional function is to be executed during the auto-refresh operation, the additional function controller 130 activates the control signal "con" to the additional function executer which is the output driver circuit 150 in FIG. 5 to control the output driver circuit 150 to execute the additional function (step S20).

In that case, the selection circuit 154 of the driver circuit 150 selects one impedance code out of the fixed impedance control codes UPCF and DNCF from the fixed impedance code generator 155 and the variable impedance control codes UPCV and DNCV from the variable impedance code generator 156, in response to the control signal "con" for generating the impedance control codes UPC and DNC. Subsequently, when data DQ is input from the external device during a write operation of the semiconductor memory device, the impedance of the termination circuit 153 is set according to the impedance code UPC, thus improving the signal integrity of input data DQi.

Alternatively, when output data DQo is generated during a read operation, the driving control circuit 151 applies pull-up and pull-down control signals PUi and PDi to the off-chip driver circuit 152 in response to the impedance codes UPC and DNC. The impedance of the off-chip driver circuit 152 is set according to the pull-up and pull-down control signals PUi and PDi, thus improving the signal integrity of the data DQ output to the external device.

As described above, FIGS. 4 and 5 illustrate that the temperature of the semiconductor memory device is generated, or the driver circuit for controlling input/output impedance is updated, as additional functions executed during the auto-refresh operation of the semiconductor memory device. However, the semiconductor memory device may include both of the two above-described additional functions so that the semiconductor memory device may selectively operate in response to an address from the external device. In addition to the two above-described additional functions, other various functions may be added to the semiconductor memory device.

According to the present invention as described above, a semiconductor memory device is configured such that various additional functions may be executed using unused portions during a refresh operation. Therefore, since an additional operating time is not taken to execute the additional functions, the efficiency of the semiconductor memory device is enhanced.

Example embodiments of the present invention have been disclosed herein and, although specific terms are employed, they are used and are to be interpreted in a generic and descriptive sense only and not for purposes of limitation. Accordingly, it will be understood by those of ordinary skill in the art that various changes in form and details may be made without departing from the spirit and scope of the present invention as set forth in the following claims.

The present invention is limited only as defined in the following claims and equivalents thereof.

What is claimed is:

1. A semiconductor memory device comprising:
    a mode register that activates an additional function control signal when a mode register set code indicates that an additional function is to be executed concurrently with a refresh operation;
    a command decoder that activates a refresh signal when a command indicates that the refresh operation is to be executed;
    a refresh circuit for incrementing an internal row address for indicating a row of memory cells to be refreshed upon activation of the refresh signal;
    an additional function executer; and
    an additional function controller that controls the additional function executer to carry out the additional function concurrently with the refresh operation when the additional function control signal is activated,
    wherein the additional function controller controls the additional function executer to perform the additional function upon activation of the refresh signal.

2. The semiconductor memory device of claim 1, wherein the additional function controller controls the additional function executer also according to a control code that is generated by an address register from an address signal that is externally generated.

3. The semiconductor memory device of claim 1, wherein the mode register set code is externally generated and input by the mode register through address lines when a MRS (mode register set) signal is activated, and wherein the semiconductor memory device further comprises:

a command decoder that receives a command that is externally generated to activate the MRS signal upon power-up of the semiconductor memory device.

4. The semiconductor memory device of claim 1, further comprising:
a memory cell array for storing data; and
a data input/output portion that does not transfer data to/from the memory cell array during the refresh operation, and that transfers information for the additional function during the refresh operation.

5. The semiconductor memory device of claim 4, further comprising:
a command decoder that receives a command that is externally generated to activate an active signal and a read/write signal for performing a read/write operation on the memory cell array, and wherein the data input/output portion transfers data to/from the memory cell array during the read/write operation performed while the refresh operation is not being performed.

6. The semiconductor memory device of claim 1, wherein the refresh signal is an auto-refresh signal.

7. The semiconductor memory device of claim 1, wherein the additional function executer is a temperature sensing portion having:
a temperature sensor for sensing a temperature of the semiconductor memory device; and
an analog-to-digital (A/D) converter for converting the temperature sensed by the temperature sensor into digital temperature data that is output via a data input/output portion of the semiconductor memory device in response to an activated refresh signal.

8. The semiconductor memory device of claim 1, wherein the additional function executer is a driver circuit having an impedance that is controlled in response to a control signal from the additional function controller.

9. The semiconductor memory device of claim 8, wherein the driver circuit receives data from a data input/output portion to output the received data to an external device during a read operation, and wherein the driver circuit receives data from the external device to transmit the received data to the data input/output portion during a write operation.

10. The semiconductor memory device of claim 8, wherein the driver circuit includes:
an impedance control circuit coupled to an external reference resistor and generating impedance control codes depending on the impedance of the external reference resistor in response to the control signal;
a termination circuit having a respective impedance determined by the impedance control codes for preventing reflection of data from an external device; and
an output driver circuit having a respective impedance determined by the impedance control codes for driving data to be output to the external device.

11. The semiconductor memory device of claim 1, wherein the additional function controller outputs a plurality of control signals according to a control code indicated by an external device, and wherein the additional function executer executes a respective one of a plurality of additional functions in response to each of the control signals.

12. A method of executing a refresh operation in a semiconductor memory device, comprising:
storing data within a memory cell array;
activating an additional function control signal at a mode register when a mode register set code indicates that an additional function is to be executed concurrently with the refresh operation;
not transferring data via a data input/output portion to/from the memory cell array during the refresh operation;
controlling an additional function executer to carry out the additional function concurrently with the refresh operation when the additional function control signal is activated; and
transferring information for the additional function via the data input/output portion during the refresh operation.

13. The method of claim 12, further comprising:
controlling the additional function executer also according to a control code that is generated by an address register from an address signal that is externally generated.

14. The method of claim 12, further comprising:
inputting by the mode register the mode register set code that is externally generated through address lines when a MRS (mode register set) signal is activated; and
activating the MRS signal when a command decoder receives and decodes a command that is externally generated upon power-up of the semiconductor memory device.

15. The method of claim 12, further comprising:
activating a refresh signal when a command indicates that a refresh operation is to be executed;
incrementing an internal row address for indicating a row of memory cells to be refreshed upon activation of the refresh signal; and
controlling the additional function executer to perform the additional function upon activation of the refresh signal.

16. The method of claim 12, wherein the refresh signal is an auto-refresh signal.

17. The method of claim 12, wherein the additional function executer is a temperature sensing portion that performs the steps of:
sensing a temperature of the semiconductor memory device; and
converting the temperature sensed by the temperature sensor into digital temperature data that is output via a data input/output portion of the semiconductor memory device in response to an activated refresh signal.

18. The method of claim 12, wherein the additional function executer is a driver circuit having an impedance that is controlled in response to a control signal from the additional function controller, and wherein the driver circuit performs the steps of:
receiving data from a data input/output portion to output the received data to an external device during a read operation; and
receiving data from the external device to transmit the received data to the data input/output portion during a write operation.

19. The method of claim 18, wherein the driver circuit further performs the steps of:
generating impedance control codes depending on an impedance of an external reference resistor in response to the control signal;
setting a respective impedance of a termination circuit depending on the impedance control codes for preventing reflection of data from an external device; and
setting a respective impedance of an output driver circuit depending on the impedance control codes for driving data to be output to the external device.

20. The method of claim 12, further comprising:
generating a plurality of control signals according to a control code indicated by an external device; and
executing by the additional function executer a respective one of a plurality of additional functions in response to each of the control signals.

* * * * *